United States Patent [19]

Miller

[11] Patent Number: 4,829,172
[45] Date of Patent: May 9, 1989

[54] OPTICAL RANGING BY PHASE SHIFT MEASUREMENT WITH RETURN SIGNAL LEVEL COMPENSATION

[75] Inventor: Gabriel L. Miller, Westfield, N.J.

[73] Assignee: American Telephone and Telegraph Company AT&T Bell Laboratories, Murray Hill, N.J.

[21] Appl. No.: 75,912

[22] Filed: Jul. 20, 1987

[51] Int. Cl.$^4$ ............................................. G01J 1/32
[52] U.S. Cl. ....................................... 250/205; 356/5
[58] Field of Search .................... 356/5; 250/560, 205, 250/561

[56] References Cited

U.S. PATENT DOCUMENTS

| | | | |
|---|---|---|---|
| 4,346,989 | 8/1982 | Gort et al. | 356/5 |
| 4,453,825 | 6/1984 | Buck et al. | 356/5 |
| 4,639,129 | 1/1987 | Hullein et al. | 356/5 |
| 4,712,915 | 12/1987 | Kosakowski et al. | 356/5 |

OTHER PUBLICATIONS

SPIE, vol. 230, Minicomputers and Microprocessors in Optical Systems, "Fully Integrated Microprocessor-Controlled Surveying Instrument", A. F. Gort, Jun. 1980, pp. 158–167.
"Redundant Sensors for Mobile Robot Navigation", Master's Thesis at the Massachusetts Institute of Technology by Anita N. Flynn, U.S. Government unclassified report No. AI-TR-859, Government accession No. AD-A101087.

Primary Examiner—David C. Nelms
Attorney, Agent, or Firm—Wilford L. Wisner

[57] ABSTRACT

There is disclosed an optical ranging system adapted for use with widely varying return signal levels. Automatic signal level control is achieved in two parts, a passive optical part and an active electronic AGC part. The optical part is based on the coaxial arrangement of transmitting and receiving elements in which the shielded transmitting element is mounted in front of the receiving element, which includes Fresnel lens which comprises a plastic casting. The electronic AGC portion of the system includes means for providing a voltage drive (with low internal impedance) for the final AGC transistor when it would tend to be slow, so little phase shift in the control results from changes in the signal levels. Thereby, the determination of distance (the ranging) by phase shift measurement is kept reliable as signal level changes. This optical ranging system is especially adapted for mounting on autonomously guided vehicles (robot carts), which are important for material handling and inventory control in manufacturing systems in factory environments.

10 Claims, 4 Drawing Sheets

OPTICAL RANGING BY PHASE SHIFT MEASUREMENT WITH RETURN SIGNAL LEVEL COMPENSATION

FIELD OF THE INVENTION

This invention relates to simple, low cost optical ranging by phase shift measurement, and particularly such optical ranging in which the return signal experiences a very large and rapid variation in amplitude as is typical in the use of an optical ranger as an aid for robot cart navigation in a factory environment.

BACKGROUND OF THE INVENTION

In the general field of distance determination by optical phase shift measurement it is known to make fairly precise measurements as, for example, for surveying of for the meaurement of the relative positions of two known objects such as airplane and the measuring station over widely varying distances, e.g., by means of a retro-reflector on the moving object. For instance, see the article by Alfred F. Gort, "Fully Integrated Microprocessor-Controlled Surveying Instrument", in the journal, SPIE, Vol. 230 Minicomputers and Microprocessors in Optical Systems, June 1980, pp. 158–167.

It is also known to make similar measurements when the return beam is reflected or diffused from a scattering surface but with a much more expensive set of techniques as in a mobile rover or cart for use in a hostile environment such as the moon or Mars. For example, see the article by Anita N. Flynn, entitled "Redundant Sensors for Mobile Robot Navigation", submitted to the Department of Electrical Engineering and Computer Science as a master's thesis at the Massachusetts Institute of Technology. This document is also available from the United States Government as an unclassified report No. AI-TR-859 with the Government accession No. AD-A101087, as a result of work done under Office of Naval Research Contract No. N00014-80-C-0505. (The report date is September 1985.)

There is another area of interest for such optical ranging which combines many of the problems of the two types of systems mentioned above, but which, from an economic viewpoint, cannot support the high level of complexity that was proposed to obtain in the latter case. That environment is the typical factory, in which truly autonomous mobile robot carts can be of substantial assistance in inventory control and overall material management because of their lack of dependence upon a human operator's decisions and variabilities.

However, in that environment the optical ranging needed to control such a robot cart must be of very low cost and at the same time must work with scattering from surfaces of varying reflectivity and over a wide range of distances. As a consequence the signal levels of the returning optical radiation can typically vary by more than a thousand to one, depending on the conditions. The rapidly increasing world-wide use of existing designs of mobile robot carts or "autonomously guided vehicles" in factories have mainly employed buried cables in the floor for vehicle guidance. However, the buried cable approach is expensive and insufficiently flexible for many of the evolving uses of mobile carts, especially for material transport. The use of optical radar for ranging, typically with an infrared beam, immediately yields more flexibility for cart navigation and can provide the added advantage of the ability to read wall-mounted bar codes as the cart moves so that it can unambiguously correct its current estimate of position at periodic intervals. Nevertheless, there has been difficulty in making such a system at low cost, that can in addition provide 360° coverage over a wide range of distances and that can operate at reasonably high speed.

If in order to reduce cost one decides to use a rotating light beam to cover 360° about the cart, together with a continuous-wave phase shift measurement to provide range information, the primary problem to be faced is that of handling the rapidly fluctuating and large dynamic range of optical intensity expected in the received signal. The difficulty is not primarily the wide range of intensity per se but the fact that it needs to be handled without introducing any change in phase great enough to perturb the range measurement itself.

An additional problem is that it is also absolutely essential to avoid any leakage of transmitted light into the receiving elements of the optical ranging system. Any such light leakage would automatically invalidate all range measurements involving returned optical signals of low intensity.

SUMMARY OF THE INVENTION

According to primary features of the invention, the foregoing difficulties are circumvented by breaking the problem of signal level control into two parts. A passive optical part of the level control system provides a factor of about 20 in partially compensating for the dynamic range variation of the return signals arising from distance variations, while an active electronic AGC part provides the remaining factor of about 50 dynamic range control.

According to a subsidiary feature of the invention the optical aspects of the signal level control system simultaneously prevent the leakage of transmitted light directly into the receiver by virtue of the coaxial arrangement of the transmitting and receiving elements in which the shielded transmitting element is mounted in front of the receiving element.

As a direct consequence of the absence of light leakage from the transmitter to the receiver it has proved possible to use a very large, (4" diameter) receiving aperture to collect returning signal radiation. This large receiving aperture has resulted in the ability to determine ranges to within ≈2.5 inches at 20 feet, and ≠0.5 inches at 5 feet, with an overall system bandwidth of ≈1 KHz, while using only 1 milliwatt of radiated optical power.

Moreover, according to a further advantage of the invention, all of the foregoing solutions are achieved without resorting to expensive optical components such as high quality mirrors or lenses. Indeed, we are able to use a low cost Fresnel lens (which is a plastic casting) as the primary optical element of the optical ranging system.

More specifically, the coaxial optics of the ranging system are such that the receiving elements intentionally block increasingly large portions of the signal as the target to which the distance is being measured becomes closer to the optical ranger.

More specifically, the electronic part of the AGC system depends heavily upon having a voltage (low internal impedance) drive for one element of the AGC amplifier when the transistor element therein would be operating in a low current portion of its operating range and therefore would tend to be slow if its driving element were in a current driving (high impedance) condition. The feature of the invention providing the voltage signal drive overcomes this. In the other part of the signal range in which the operating current of the AGC element becomes high, it has no inherent tendency to become slow so the nature of the driving signal is not critical, and it does not need to be a voltage driving circuit under those conditions. Advantageously, the AGC action is rapid and introduces negligible phase shift related to signal ampltitude.

These and further features and advantages of the invention will become apparent from the following detailed description together with the drawings.

DETAILED DESCRIPTION

Figure 1:
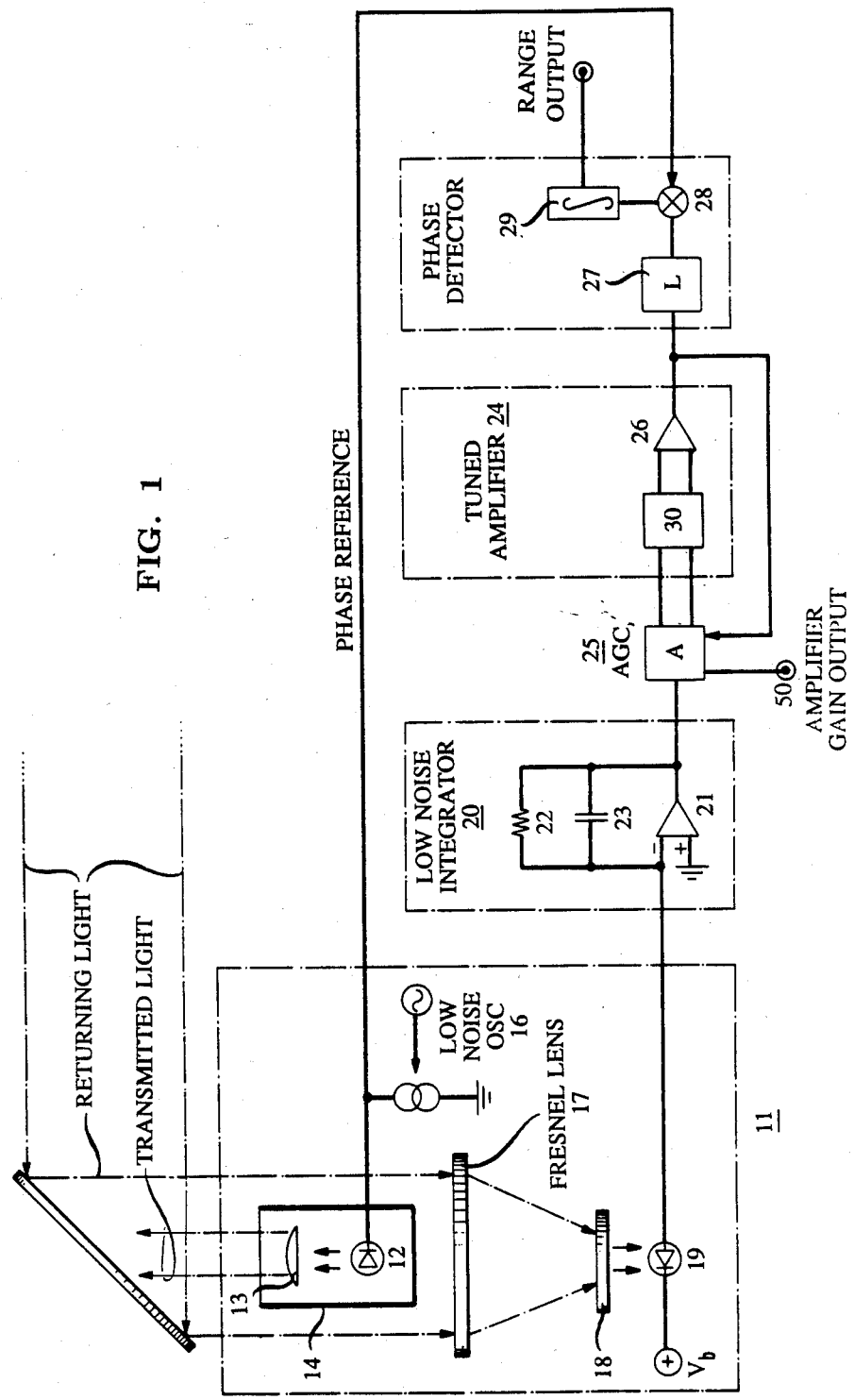
FIG. 1 shows a schematic and block diagram of the low cost optical ranging system.

The essential components of FIG. 1 are shown in the simplest possible form; but it should be understood that they are all mounted on a mobile robot cart of the type used in factory environments for material transfer and inventory control. While the transmitted incoherent light beam of the ranging system from LED 12 is shown as being transmitted vertically up through lens 13, that direction could just as well be any other, inasmuch as the Optical system located directly under a diagonally mounted, rotating, planar mirror. In this way, the transmitted and return beams can be rotated through a complete circle about the cart. Notice the structure of the directing element 14 for the transmitted beam from LED 12. This stucture 14 prevents any of the transmiited light from LED 12 from being scattered from the lens 13, or from the inner surfaces of the guiding structure 14, back into the receiver 19 through Fresnel lens 17. This lack of backward scattering of transmitted light within the ranging system is essential to the accurate operation of the system with low levels of returned signals. LED 12 emits 0.82 micrometer incoherent infrared radiation at an average power level of about one (1) milliwatt. This radiation is formedinto a one-inch diameter collimated beam by lens 13, thereby providing an optical power denisty low enough to be unconditionally eye-safe, a very important consideration for all factory applications. The output of the LED is 100% modulated at 5 MHz by the low phase-noise oscillator 16, which draws a peak current of 100 milliamperes through LED 12. The returning optical radtion, which illustratively comes from scattering centers anywhere between 1 to 20 feet from the mobile cart, is focused by the four-inch diameter coaxial Fresnel lens 17 through a multilayer "cold mirror" optical filter 18 onto the receiver photodiode 19. It should be noted that the "cold mirror" designation of mirror 18 means that it reflects essentially all radiation with a wavelength shorter than about 0.75 micrometers, while passing everything of longer wavelength onto diode 19. At the same time the silicon bandgap energy of diode 19 automatically cuts out everything longer than about 1 micrometer, thereby effectively bracketing the $0.82\mu$ radiation of interest.

Photodiode 19 ends the optical part of the mobile cart ranging system. The resulting electrical signal from diode 19 is then fed into the low-noise integrator 20 which consists of operational amplifier 21, resistor 22 and feedback capacitor 23.

Following the preamplifier stage 20 the signal enters the variable gain circuit designated as "A" in FIG. 1 (and which is numbered as 25) and then enters the tuned amplifier 24, including ciruitry 30 and amplifier 26, to be discussed hereinafter. The output of the tuned amplifier stage 24 is applied to the limiter 27 which generates a square wave output so that the relative phase difference between transmitted and return light can be accurately measured by zero crossings (which are nearly vertical as in a square wave). The output of limiter 27 is multiplied by the output of the low-noise oscillator 16 in multiplier 28 and then filtered in circuit 29. The wide range gain element 25 provides the electronic portion of the signal level control of the invention. The variable gain magnitude itself is continuously monitored at output point 50 as indicated in FIG. 1.

The distance to the reflecting or light-scattering object is determined from the time delay between the transmitted and received signals. This time difference is in turn indicated by the phase shift between the 5 MHz amplitude modulation on the transmitted and received radiation.

Figure 2:
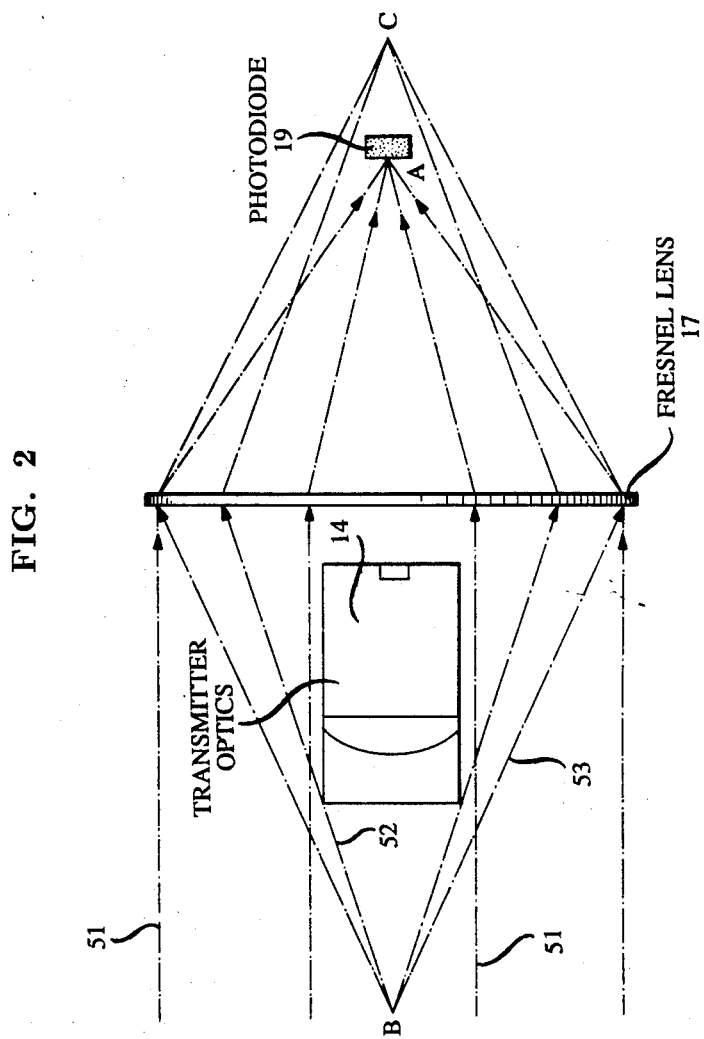
FIG. 2 shows the elements of the coaxial optical system, illustrating the shielding effect for closely spaced scattering centers and the arrangement of the transmitting optics in front of the receiving optics.

In FIG. 2 is shown a diagram of the optical portion of the signal level control solution of the invention for optical ranging on a mobile robot cart or autonomously guided vehicle. It will be seen in FIG. 2 that infrared radiation returned from a very close scattering center B will be blocked from the central portion of the Fresnel lens 17. As a consequence, light scattered from B only enters the peripheral region of the Fresnel lens and is thereby focused at C, i.e., entirely behind the photodiode 19 which is located at A. As a result, light from scattering centers as close as that shown at B generate no photodiode signal. In fact, the system only responds to light from distances greater than approximately one foot from the lens 17. It is only for objects at a distance of approximately five feet or greater from the lens that no shielding of the photodiode takes place; i.e., the system automatically and increasingly discriminates against light scattered from objects approximately five feet or closer to the lens. On the other hand, light from distant objects follows the path of the parallel dotted lines 51 and is focused directly upon the photodiode. In this way, light returned from nearby objects is automatically discriminated against by the nature of the system's coaxial optics. Were it not for this fact, such light could overload the receiver by virtue of its great intensity.

This geometric ray optic portion of the automatic signal level control provides a factor of about 20 of the total of about a thousand which is required. The remaining factor $\approx 50$ in signal level control is provided by the active electronic part of the circuit shown in FIG. 3.

Here the signal 37 from the preamplifier stage 20 (in FIG. 1) drives the amplifying element 31 to provide an output signal current $I_s$ at the common emitters of transistors 32 and 33. This current $I_s$ is small compared to the standing current $I_0$ which flows through amplifying element 31. Furthermore, $I_s$ divides between the transistors 32 and 33 emitters in exactly the same way as does the current $I_0$. This current division can be understood by first noting that the base of transistor 33 is held at a convenient fixed potential (which can be ground), while the base of transistor 32 is driven from the automatic gain control feedback circuit 38, which will be more fully detailed hereafter. Depending on the signal-dependent base voltage difference between transistors 32 and 33, the current $I_0$ splits into $I_1$ and $I_2$ where of course $I_1+I_2=I_0$.

It can be shown that the dynamic impedance looking into the emitter of transistor 32 is given by the relationship $$Z_1=(KT/qI_1)$$

and that at the emitter of transistor 33 is $$Z_2=(KT/qI_2)$$

Here K, T and q have the usual significance of Boltzmann's constant, absolute temperature and electronic charge, respectively. The total dynamic impedance $Z_T$ to ground at point A is essentially just that of $Z_1$ and $Z_2$ in parallel, namely, $Z_T=KT/qI_0$) which is therefore a constant and entirely independent of how $I_1$ and $I_2$ share the current $I_0$. The signal voltage at A is therefore given by $V_s=I_sZ_T$ and consequently the signal current flowing through the grounded base stage of transistor 33 is just $V_s/Z_2=(I_sI_2/I_0)$, i.e., the gain is exactly linear in $I_2$.

Therefore, for effective automatic gain control action, $I_2$ should be small when the returned optical signal level received at diode 19 is large; and the converse is also true. Moreover, this result should preferably be obtained with very little difference in overall phase shift from the one signal condition to the other.

Nevertheless, in conventional AGC circuits, large gain-dependent phase shifts are often observed. This is in part due to the fact that at low currents the base-emitter charging time constant of bipolar transistors to become longer because of the corresponding increase in the junction impedances.

This effect can be compensated in a very simple way by arranging that the circuitry that drives transistor 33 at its emitter provides essentially a low impedance source when the current $I_2$ is small (and when therefore transistor 33 would tend to be slow), and that, conversely, the nature of the driving signal is relatively unimportant when the current $I_2$ is large and transistor 33 experiences relatively little phase shift in its operation. This feature is automatically incorporated in the scheme of FIG. 3 since the impedance at the transistor 32 emitter is necessarily low when the current $I_2$ is small.

We have thereby approache the primary objectiveof a relatively small phase shift difference between the extremes of signal values. Additional difficulties remain, however, on account of the inevitable existence of small stray capacitances from the common emitter point A to the collector of transistor 33.

This problem can be handled in turn by noting that essentially all the current $I_0$ that flows at point A must also flow at point B. As a consequence, the dynamic impedance of diode 34 must also equal $KT/qI_0$ and, therefore also, the signal voltage at point B must always be essentially equal and opposite to that at point A. (Note that capacitor 35 is large, thereby holding the anode of diode 34 at AC ground.) As a result the trimmer capacitor 36 provides a bridge-type adjustment to cancel the stray capacitance across transistor 33, thereby finally allowing a wide range of gain control with exceedingly low overall phase shift.

Figure 3:
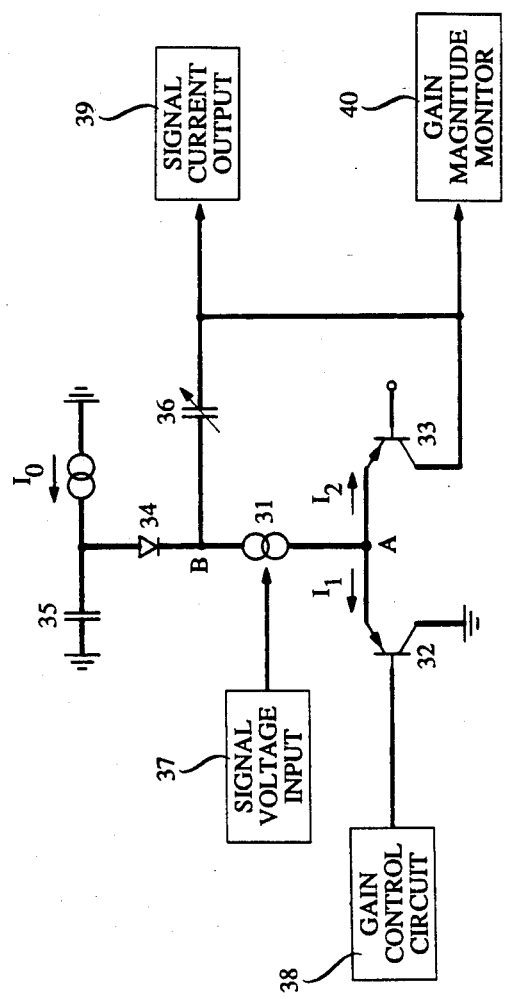
FIG. 3 shows a schematic and block diagram of the low phase shift variable gain stage which is an essential consituent of the active electronic part of the AGC solution.
Figure 4:
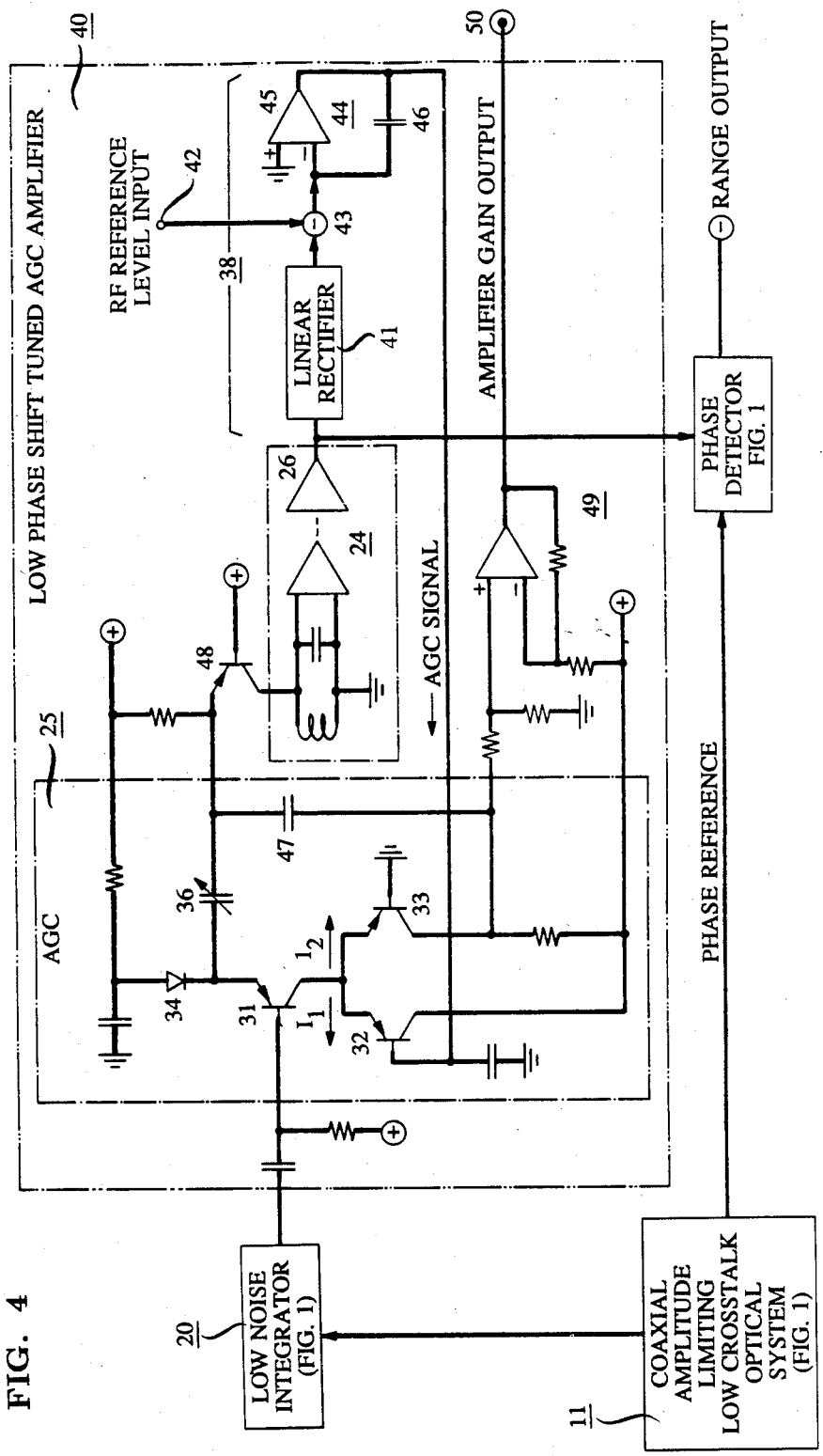
FIG. 4 shows a partially schematic and partially diagrammatic illustration of the entire optical ranging system which serves to illustrate how all of the foregoing features fit together ih the complete system.

The overall operation of the elements of the system explained above can be appreciated by examining the diagram of FIG. 4. The electronic elements of the AGC arrangement as discussed in FIGS. 1 and 3 are now seen in context in FIG. 4. Here the output of the low noise integrating preamplifier stage 20 drives the base of transistor 31, while its collector current divides into $I_1$ and $I_2$ at the emitters of transistors 32 and 33. The relative magnitudes of $I_1$ and $I_2$ are controlled by the AGC signal which is applied to the base of transistor 32 as previously explained. This AGC signal comes from the gain control feedback circuitry 38 which comprises a linear rectifier which receives the same signal that drives limiter 27 (of FIG. 1). The linear rectifier 41 applies the rectified result to the input of the subtracter 43 which is also supplied with the desired RF reference level input 42. To the extent that the signal is not at the level required for accurate phase measurement that error is integrated by error integrator 44, which consists of operational amplifier 45 together with its feedback capacitor 46. The output of the error integrator in turn provides the gain control feedback signal applied to the base of transistor 32. In FIG. 4 we also see that the signal at the collector of transistor 33 of the automatic gain control stage is applied to the input of the tuned amplifier 24 through capacitor 47 and the grounded base stage 48. As a result the AGC signal is constantly applied so as to maintain the RF amplitude level at the output of tuned amplifier 24 (of FIG. 1), and at the input to limiter 27, at a constant preassigned level. This cascaded limiting action ensures that very accurate phase measurements can be achieved.

As previously explained, the gain of the gain control ciruitry consisting of transistors 31, 32 and 33 is accurately proportional to magnitude of the current $I_2$ flowing through transistor 33. This quantity itself is monitored by the amplifier circuit 49, thereby providing a constant linear measure of the required amplifier gain (i.e., of the optical signal strenght) at terminal 50, as indicated in FIG. 4. This quantity in turn is constantly monitored, and range data is accumulated if and only if the electronic system is known to be operating within its 50:1 preassigned gain range.

In addition, it is important to note that the amplifier gain monitor output at terminal 50 also provides very useful independent navigational information for a robot cart. This is because, since the target range is known from the phase shift measurement, the inverse square law correction can be applied for the returning radiation as a function purely of distance. Any remaining variation in signal strength, as inferred from the output signal at terminal 50, is then attributed to the effective infrared reflectivity of the target surface. In this way an infrared "brightness" map of the robot cart surroundings is continuously available. This is in addition to, and completely independent from, the "range" map provided by the optical phase shift measurement.

The quality of the described AGC circuitry and optical signal level control that has been previously discussed, is to provide very low phase shift as well as very good automatic gain control and gain magnitude monitoring throughout the signal range. Measurement has demonstrated that very low relative phase shift over the entire range as well as effective gain control has been achieved with the exceedingly simple, and therefore low cost, system that has been described.

In the particular use preferred for the invention it is possible to employ the final distance measurements that result to create polar plots of objects or obstacles in the environment. Such information can then be compared to a known stored maps of obstacles in the factory and thereby used for navigational purposes.

Nevertheless, it should be apparent that the very simple automatic gain control circuitry, linear gain monitoring, and overall two-part optical and electronic signal level control provided by this invention can be useful in any environment, (whether or not in a factory and whether or not involving a mobile cart or guided vehicle), in which the optical ranging is affected by large and rapid changes in target distances or by large variations in the refelectivity or scattering capability of target surfaces.

What is claimed is:

1. An optical ranging system of the type employing
   means for radiating optical energy bearing continuous amplitude modulation,
   means for gathering a portion of the optical energy returned from an object, and
   means for measuring distance to the object by detecting the phase difference between the modulation of the radiated optical energy and the modulation of the returned optical energy, including means for compensating for variations in the level of the returned optical energy,
   said system being characterize in that the compensating means includes an optical portion based upon the partial optical blocking of the gathering means by the radiating means and an electronic portion based upon an automatic gain control arrangement in which phase shift occuring in such electronic portion varies negligibly with signal level, and the gathering means includes means for focusing the non-blocked portion of the returned optical energy arriving at the gathering means.

2. A system according to claim 1 further characterized in that
   the automatic gain control arrangement includes a gain control element capable of its most rapid response at a first emitter-collector current level, but experiencing neglibible degradation if drived by a low-impedance voltage source when its emitter-collector current level is at a second level much lower than said first level, and includes a driving stage which requires a low-impedance output circuit characteristic enabling it to act as a voltage source for the gain control element when said gain control element has its emitter-collector current near the second level.

3. A system according to claim 2 further characterized in that the gain control element and the driving stage are supplied emitter-collector currents through a common node to split the current from a source of substantially constant current.

4. An optical ranging system of the type employing
   means for radiating optical energy bearing continuous modulation
   means for gathering a portion of the scattered optical energy returned form an object and
   means for measuring distance to the object by detecting the phase difference between the modulation of the radiated optical energy and the modulation of the returned optical energy, including means for compensating for variations in the level of the returned optical energy said system being characterized in that
   the raditing means is positioned in front of the gathering means and adapted to minimize propagation of optical energy from the radiating means to the gathering means other than via the object, and in addition the gathering means includes means for focusing the nonblocked portions of the returned optical energy arriving at the gathering means in such a way as to reduce the effect of the inverse square law dependence of the received scattered light-intensity upon distance of the scattering object.

5. A system according to claim 3 or 4 further characterized by
   means for detecting the modulation of the returned optical energy, means for integrating the detected modulation,
   means for integrating the difference between a desired reference level for a function of the detected optical energy and the actual level of such function, and
   means for applying the outputs of both integrating means to an automatic gain control circuit.

6. A system according to claim 3 or 4 further characterized in that said system is mounted on an autonomously guided vehicle free to move within a manufacturing facility.

7. A system according to claim 4 further characterized in that
   the gathering means is a Fresnel lens having a diameter greater than that of the radiating means and being substantially coaxial therewith.

8. A system according to claim 3 further characterized in that the automatic gain control arrangement is adapted for an overall amplifier gain that is accurately linearly related to an output voltage, the system being arranged to generate this output voltage to enable its monitoring at all times.

9. A system according to claim 1 further characterized in that
   the optical portion of the compensating means is adapted so that the radiating means increasingly blocks the returned optical energy from the gathering means as the returned optical energy is returned as scattered light from an object increasingly close to the radiation means.

10. A system accordihg to claim 2 further characterized in that
    the automatic gain control arrangement includes a capacitance bridge which counteracts residual parasitic capacitance effects in the gain control element.

* * * * *

UNITED STATES PATENT AND TRADEMARK OFFICE
CERTIFICATE OF CORRECTION

PATENT NO. : 4,829,172

DATED : May 9, 1989

INVENTOR(S) : Gabriel L. Miller

It is certified that error appears in the above-identified patent and that said Letters Patent is hereby corrected as shown below:

Column 7, line 32, "characterize" should read --characterized--.
Column 7, line 48, "neglibible" should read --negligible--.
Column 7, line 48, "drived" should read --driven--.
Column 7, line 52, "requires" should read --acquires--.
Column 8, line 4, "form" should read --from--.
Column 8, line 12, "raditing" should read --radiating--.
Column 8, line 56, "radiation" should read --radiating--.

Signed and Sealed this

Tenth Day of December, 1991

Attest:

HARRY F. MANBECK, JR.

*Attesting Officer*          *Commissioner of Patents and Trademarks*